United States Patent

Li

[11] Patent Number: 5,852,559
[45] Date of Patent: *Dec. 22, 1998

[54] POWER APPLICATION CIRCUITS UTILIZING BIDIRECTIONAL INSULATED GATE BIPOLAR TRANSISTOR

[75] Inventor: Hsin-hua Li, Brookfield, Wis.

[73] Assignee: Allen Bradley Company, LLC, Milwaukee, Wis.

[*] Notice: The term of this patent shall not extend beyond the expiration date of Pat. No. 5,847,657.

[21] Appl. No.: 719,194

[22] Filed: Sep. 24, 1996

[51] Int. Cl.$^6$ .................................................. H02M 5/293
[52] U.S. Cl. .......................................... 363/163; 257/575
[58] Field of Search ................................... 363/159, 160, 363/161, 163; 257/119, 133, 138, 341, 343, 575

[56] References Cited

U.S. PATENT DOCUMENTS

| | | |
|---|---|---|
| 4,471,372 | 9/1984 | Tihanyi . |
| 4,477,742 | 10/1984 | Janutka . |
| 4,480,201 | 10/1984 | Jaeschke . |
| 4,487,458 | 12/1984 | Janutka . |
| 4,488,068 | 12/1984 | Janutka . |
| 4,491,750 | 1/1985 | Janutka . |
| 4,500,802 | 2/1985 | Janutka . |
| 4,541,001 | 9/1985 | Schutten et al. . |
| 4,542,396 | 9/1985 | Schutten et al. . |
| 4,546,367 | 10/1985 | Schutten et al. . |
| 4,553,151 | 11/1985 | Schutten et al. . |
| 4,571,512 | 2/1986 | Schutten et al. . |
| 4,574,207 | 3/1986 | Benjamin et al. . |
| 4,574,208 | 3/1986 | Lade et al. . |
| 4,574,209 | 3/1986 | Lade et al. . |
| 4,577,208 | 3/1986 | Schutten et al. . |
| 4,612,465 | 9/1986 | Schutten et al. . |
| 4,622,568 | 11/1986 | Schutten et al. . |
| 4,622,569 | 11/1986 | Lade et al. . |
| 4,755,697 | 7/1988 | Kinzer . |
| 4,912,541 | 3/1990 | Baliga et al. ............................. 357/38 |
| 5,323,044 | 6/1994 | Rumennik et al. ..................... 257/379 |
| 5,493,134 | 2/1996 | Mehrotra et al. . |
| 5,514,608 | 5/1996 | Williams et al. ......................... 437/44 |
| 5,523,601 | 6/1996 | Yanagigawa ........................... 257/409 |
| 5,585,650 | 12/1996 | Kumagai ................................ 257/124 |
| 5,594,636 | 1/1997 | Schauder ................................ 363/159 |
| 5,659,190 | 8/1997 | Litwin ................................... 257/378 |

Primary Examiner—Peter S. Wong
Assistant Examiner—Derek J. Jardieu
Attorney, Agent, or Firm—Joseph N. Ziebert; John M. Miller; John J. Horn

[57] ABSTRACT

A matrix converter utilizes a bidirectional lateral insulated gate bipolar transistor (IGBT) including two gate electrodes. The IGBT can conduct in two directions. The matrix converter preferably is a three phase matrix converter including nine bidirectional IGBT switches. The IGBT switches are controlled by a control circuit which includes eighteen control lines, two for each IGBT. Additionally, the bidirectional IGBT can be used in a precharge circuit of a power inverter or in a dynamic brake associated with a motor controller.

15 Claims, 6 Drawing Sheets

POWER APPLICATION CIRCUITS UTILIZING BIDIRECTIONAL INSULATED GATE BIPOLAR TRANSISTOR

CROSS REFERENCE TO RELATED APPLICATIONS

The present invention is related to the U.S. patent application Ser. No. 08/718,842, entitled, "Bidirectional Lateral Insulated Gate Bipolar Transistor", filed by Li, on an even date herewith and assigned to the assignee of the present invention.

FIELD OF THE INVENTION

The present invention relates generally to power control circuits, and more particularly to power control circuits utilizing bidirectional insulated gate bipolar transistors.

BACKGROUND OF THE INVENTION

Insulated gate bipolar transistors (IGBTs) have been used in a variety of power, control, and electronic applications, such as, in motor controllers, in motor drives, and in appliance control. IGBTs are particularly suited for such applications because of their low on-state voltage drop and high switching speed.

Various structures for IGBTs, such as, planar IGBTs, trench IGBTs, and lateral IGBTs, have been designed to customize the operational properties of the device for particular applications. For example, planar or vertical IGBTs utilize a convenient structure for a high power (e.g., high voltage and high current) switch. The planar IGBT includes a collector at a bottom side, a gate at a top side, and an emitter surrounding the gate at the top side. Trench gate IGBTs have a similar general structure to the planar IGBTs. However, trench IGBTs include a trench within which the gate is situated. The trench reduces the on-state voltage drop of the device. The current path of planar and trench IGBTs is vertical from the collector to the emitter.

Lateral IGBTs are often employed in lower power control and detection circuits. Lateral IGBTs do not utilize the vertical structure of the planar and trench IGBTs, where collector and emitter contacts are provided on the top and the bottom of the semiconductor material. Instead, lateral IGBTs generally include a substrate contact at a bottom side, a collector at one side of a top side, an emitter at the other side of the top side, and a gate disposed between the emitter and collector at the top side. The current path of lateral IGBTs is horizontal within the device from the collector to the emitter.

Heretofore, IGBTs, including planar IGBTs, trench IGBTs, and lateral IGBTs, were unidirectional in conducting current: only capable of conducting current in a single direction and only capable of blocking high voltage for punch-through structures in a single direction. Typically, power circuits including conventional IGBTs, must include a diode coupled in anti-parallel with the collector and with the emitter of each IGBT because conventional (unidirectional) IGBTs cannot flow current in the opposite (reverse) direction. The diode conducts in the reverse direction with respect to the IGBT when a reverse bias voltage is applied against the collector and the emitter terminals, thereby providing a path for the current to flow from emitter to collector, a commutation feature needed in many power circuits. The requirement of a diode for each conventional IGBT increases the cost of circuits utilizing conventional IGBTs.

Additionally, power circuits, including conventional IGBTs, require two IGBTs coupled in anti-parallel to allow conduction in both directions. The requirement for the use of two conventional IGBTs to conduct in both directions increases the cost associated with power circuits.

Therefore, there is a need for an IGBT which can conduct and block high voltage bidirectionally. Further, there is a need for power circuits which utilize bidirectional power switches. Further still, there is a need for a bidirectional higher power lateral IGBT.

SUMMARY OF THE INVENTION

The present invention relates to a power conversion circuit including a plurality of input conductors, an array of bidirectional insulated gate bipolar transistors, a control circuit coupled to the array, and a plurality of output conductors coupled to the array. The input conductors are configured to receive a plurality of phases of input power. The array is coupled to the input conductors. The control circuit controls the operation of the array.

The present invention also relates to a method of performing power conversion in a converter, including a control circuit and an insulated gate bipolar transistor. The insulated gate bipolar transistor has a first gate and a second gate. The first gate and the second gate are coupled to the control circuit via a first control line and a second control line. The method includes steps of providing a first gate signal with the control circuit to the first gate via the first control line, the first gate signal causing the insulated gate bipolar transistor to conduct in a first direction, and providing a second gate signal with the control circuit to the second gate via the second control line, the second gate signal causing the insulated gate bipolar transistor to conduct in a second direction. The second direction is opposite the first direction.

The present invention still further relates to a matrix AC power conversion circuit including a plurality of input conductors, a plurality of output conductors, an array of IGBTs, and a control circuit. The array of IGBTs is coupled between the plurality of output conductors and input conductors. Each IGBT of the IGBTs includes a first gate contact and a second gate contact. The control circuit is coupled to the first gate contact and the second gate contact of each of the IGBTs. Each of the IGBTs conducts in a first direction in response to a first gate signal from the control signal at the first gate contact and each of the IGBTs conducts in a second direction in response to a second gate signal from the control circuit at the second gate contact. The first direction being opposite the second direction.

According to one exemplary aspect of the present invention, a bidirectional IGBT is utilized in power circuitry, such as, matrix converters, voltage short converters, AC servo motor drives, integrated circuit controllers, appliance circuits, and other electronic applications. The bidirectional IGBT, which blocks voltage bidirectionally, can replace conventional IGBTs which require anti-parallel diodes. Additionally, the bidirectional IGBT which can control current flow in both directions can be optimally utilized in a matrix converter, which generally requires two conventional IGBTs coupled in anti-parallel for each switch.

According to another exemplary aspect of the present invention, a control circuit is utilized in a frequency conversion circuit. The control circuit includes two control lines for each IGBT. Each of the two control lines is coupled to two separate gate contacts on the IGBT. The control circuit controls conduction in a first direction or a second direction via the control signals provided on the control lines.

In still a further aspect of the present invention, a three phase matrix power converter is provided with nine bidirectional IGBT switches. Additionally, a power source converter, such as a power inverter, includes a bidirectional IGBT utilized in a pre-charge circuit of a voltage source inverter.

According to a further exemplary aspect of the present invention, the IGBT includes five contacts or terminals (e.g., two gate terminals, two collector/emitter terminals and one substrate terminal) for controlling the current flow in either direction in the transistor. The transistor advantageously utilizes the IGBT operational principles and the reduced surface field effect (RESURF) principles to conduct current and to block voltage in both directions. Therefore, the IGBT can operate bidirectionally and yet has a relatively low on-state voltage drop and relatively high switching speed.

According to yet another exemplary aspect of the present invention, the IGBT or transistor utilizes the RESURF principle or operation to block high voltages in both directions. Thin epitaxial layers are configured within the device so vertical junctions are reinforced by the larger horizontal junction (e.g., substrate junction) associated with the device. The horizontal junction is preferably configured to have a very high breakdown voltage. The horizontal junction can be a junction of a doped region (e.g., PN junction) or can utilize a buried dielectric isolation boundary within the substrate.

In accordance with still a further exemplary aspect of the present invention, the insulated gate bipolar transistor is a lateral design wherein a first emitter/connector is located on one side and a second emitter/connector is located on a second side. Two gate electrodes or contacts are located between the first and second emitter/collectors. The gate electrodes are coupled to an oxide region disposed above the drift region. The IGBT can be a N-channel or a P-channel configuration of an IGBT device.

BRIEF DESCRIPTION OF THE DRAWINGS

The invention will hereafter be described with reference to the accompanying drawings, wherein like numerals denote like elements, and.

DETAILED DESCRIPTION OF PREFERRED EXEMPLARY EMBODIMENTS

Figure 1:
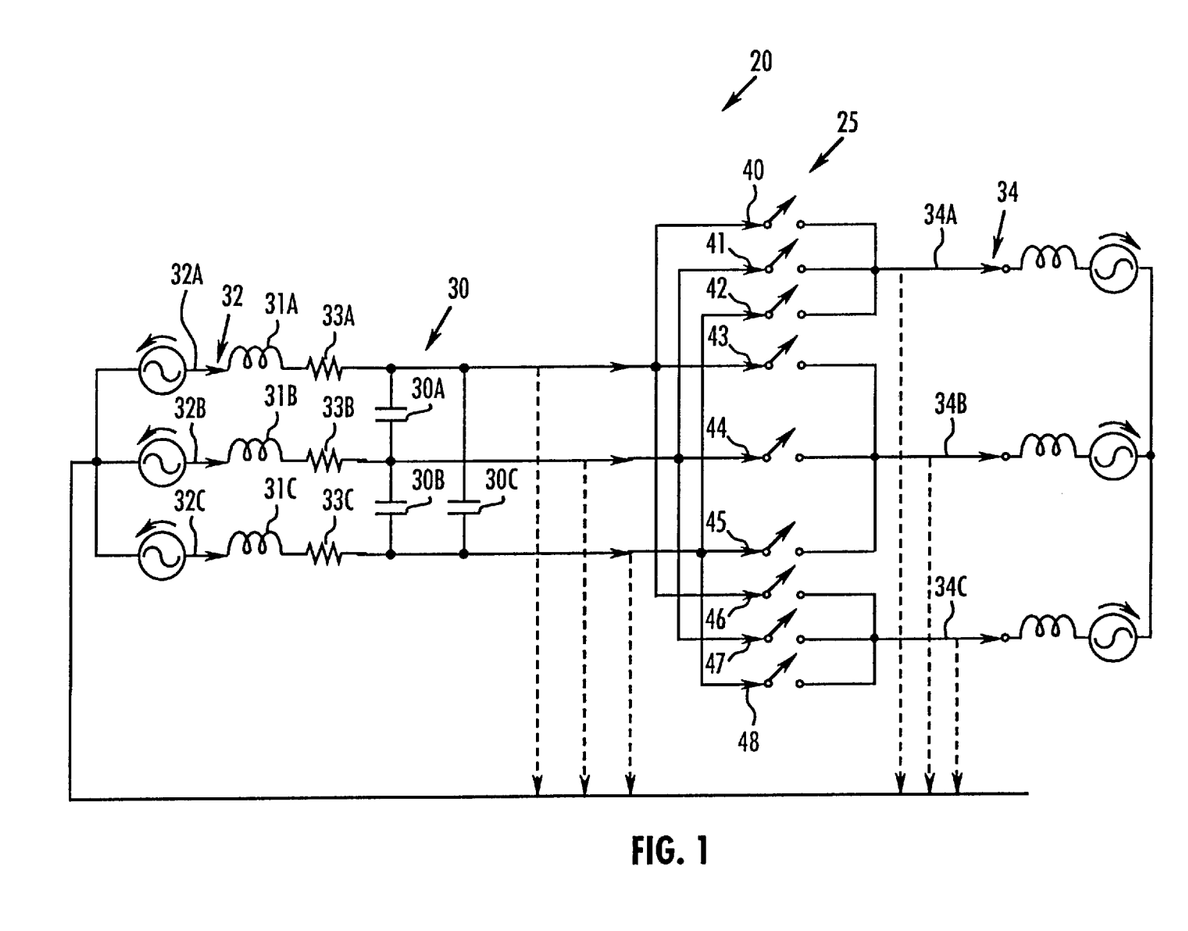
FIG. 1 is an exemplary electrical schematic drawing of a three phase AC matrix converter.

FIG. 1 is an electrical schematic drawing of a matrix converter 20 for use in power applications in accordance with an exemplary aspect of the present invention. Matrix converter 20 can be used in a variety of electronic power applications, including alternating current (AC) applications. Matrix converter 20 directly provides AC to AC power conversion as an attractive alternative to conventional conversion techniques such as those discussed with reference to FIGS. 6 and 7. Matrix converter 20 is preferably a three-phase matrix converter receiving three phases of AC power on input conductors 32a, 32b, and 32c. Alternatively, matrix converter 20 can be any number of a plurality of phases.

Matrix converter 20 includes an array 25 of bidirectional switches 40–48, a bank 30 of capacitors 30a–c, input conductors 32a–c, and output conductors 34a–c. AC power is provided through inductors 31a, 31b, and 31c and resistors 33a, 33b, and 33c to bank 30 of capacitors 30a–c. Output conductors 34a, 34b, and 34c can be coupled to a three-phase induction motor, or to other apparatus. Alternatively, other appliances or different phase devices can be utilized.

Bidirectional switches 40–48 in array 25 apply the power from input conductors 32a–c bidirectionally to output conductors 34a, 34b, and 34c. Switches 40–48 are controlled in accordance with a matrix conversion algorithm. The operation of the algorithm ensures that short circuits do not occur on output conductors 34a–c and on input conductors 32a–c and ensures that switches 40–48 provide appropriate power at appropriate times to output conductors 34a–c. Preferably, the AC power at input conductors 32a–c is converted to a different frequency of AC power; the different frequency AC power is provided at output conductors 34a–c.

Array 25 includes bidirectional switches 40, 41, 42, 43, 44, 45, 46, 47, and 48. Switches 40, 41, and 42 are coupled to output conductor 34a; switches 43, 44, and 45 are coupled to output conductor 34b, and switches 46, 47, and 48, are coupled to output conductor 34c. Switches 40, 43, and 46 are coupled to input conductor 32a through resistor 33a and inductor 31a. Switches 41, 44, and 47 are coupled to input conductor 32b through resistor 33b and inductor 31b. Switches 42, 45, and 48 are coupled to input conductor 32c through resistor 33c and inductor 31c.

Bank 30 includes capacitors 30a–c. Capacitor 30a is coupled between switches 40, 43, 46, and switches 41, 44, and 47. Capacitor 30b is coupled between switches 41, 44, 47, and switches 42, 45, and 48. Capacitor 30c is coupled between switches 42, 45, 48 and switches 40, 43, and 45. Bank 30 can be replaced by a variety of capacitive elements or circuits.

The control algorithm operates to ensure that during a first time, there is exactly one switch of switches 40–42, one switch of switches 43–45 and one switch of switches 46–47 closed to avoid short circuits on output lines 34a–c. At other times, two switches of switches 40–42, two switches of switches 43–45 and two switches of switches 46–47 are closed to ensure current commutation. In conventional matrix converters, typically at least 18 conventional IGBTs are required to provide the operation of the nine bidirectional switches 40–48. At least two IGBTs coupled in anti-parallel are required for each of switches 40–48 because conventional IGBTs are unidirectional in current conduction. Additionally, many conventional IGBT configurations require that an additional diode be coupled in series with the conventional IGBT to protect the IGBT from reverse bias breakdowns. Therefore, conventional matrix converters using conventional IGBTs can require at least 18 diodes and 18 IGBTs to implement switches 40–48 of matrix converter 20.

Figure 2:
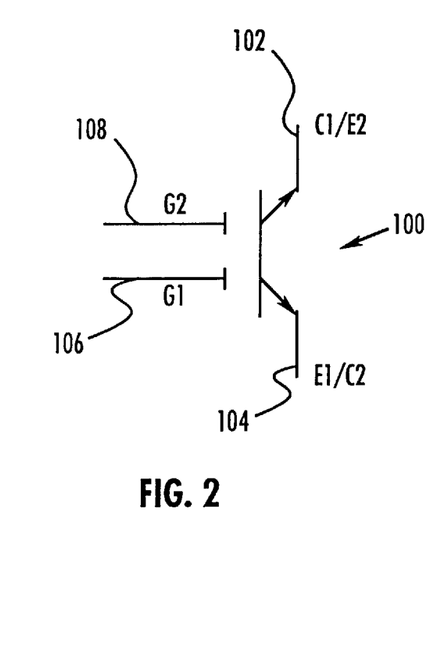
FIG. 2 is an electrical schematic circuit symbol of an IGBT in accordance with an exemplary embodiment of the present invention.

With reference to FIG. 2, a circuit schematic symbol for a bidirectional IGBT 100 in accordance with an exemplary aspect of the present invention is shown. The IGBT 100 includes a collector/emitter contact 102, an emitter/collector contact 104, a first gate 106, and a second gate 108. Transistor or IGBT 100 is shown in a N-channel configuration. Alternatively, the schematic symbol could be adjusted to show a P-channel configuration by showing arrows pointing inward.

Contacts 102 and 104 can both be referred to as emitter/collector contacts, collector/emitter contacts, collector contacts, or emitter contacts. Collector/emitter contact 102 operates both as a collector contact when IGBT conducts from contact 102 to contact 104 and as an emitter contact when IGBT 100 conducts from contact 104 to contact 102. Conversely, contact 104 acts as an emitter contact when IGBT 100 conducts from contact 102 to contact 104 and as a collector contact when IGBT 100 conducts from contact 104 to contact 102.

IGBT 100 conducts from contact 102 to contact 104 when a positive voltage bias is provided from contact 102 to 104 and a positive potential beyond a MOSFET threshold voltage is provided to gate contact 108. A MOSFET voltage or potential can be between 2–4 volts; the appropriate bias between contact 102 and 104 must be at least 0.6 volts. The on-state voltage drop between contacts 102 and 104 is preferably less than 2.5 volts. IGBT 100 can allow more than 100 A/cm$^2$ of current flow between contacts 102 and 104 in either direction when appropriately biased at contacts 106 and 108. Alternatively, IGBT 100 can be configured for various triggering or bias voltages by adjusting doping levels, geometries, thicknesses, as well as other criteria. The described voltage biases are given as examples only and not in a limiting fashion.

IGBT 100 conducts current across a current path from contact 104 to contact 102 when a positive voltage bias is provided from contact 104 to contact 102 and a positive gate potential beyond the MOSFET threshold voltage is provided to gate 106. IGBT 100 advantageously blocks high voltage between contacts 102 and 104 when gate potentials or gate signals are not provided to either gate contact 106 or gate contact 108. Alternatively, gate signals can be negative potentials. The potentials for gate contacts 106 and 108 can be the same as each other or different from each other depending on device parameters of IGBT 100. At any one instant, preferably only one of gate contacts 106 and 108 receives the gate signal.

Figure 3:
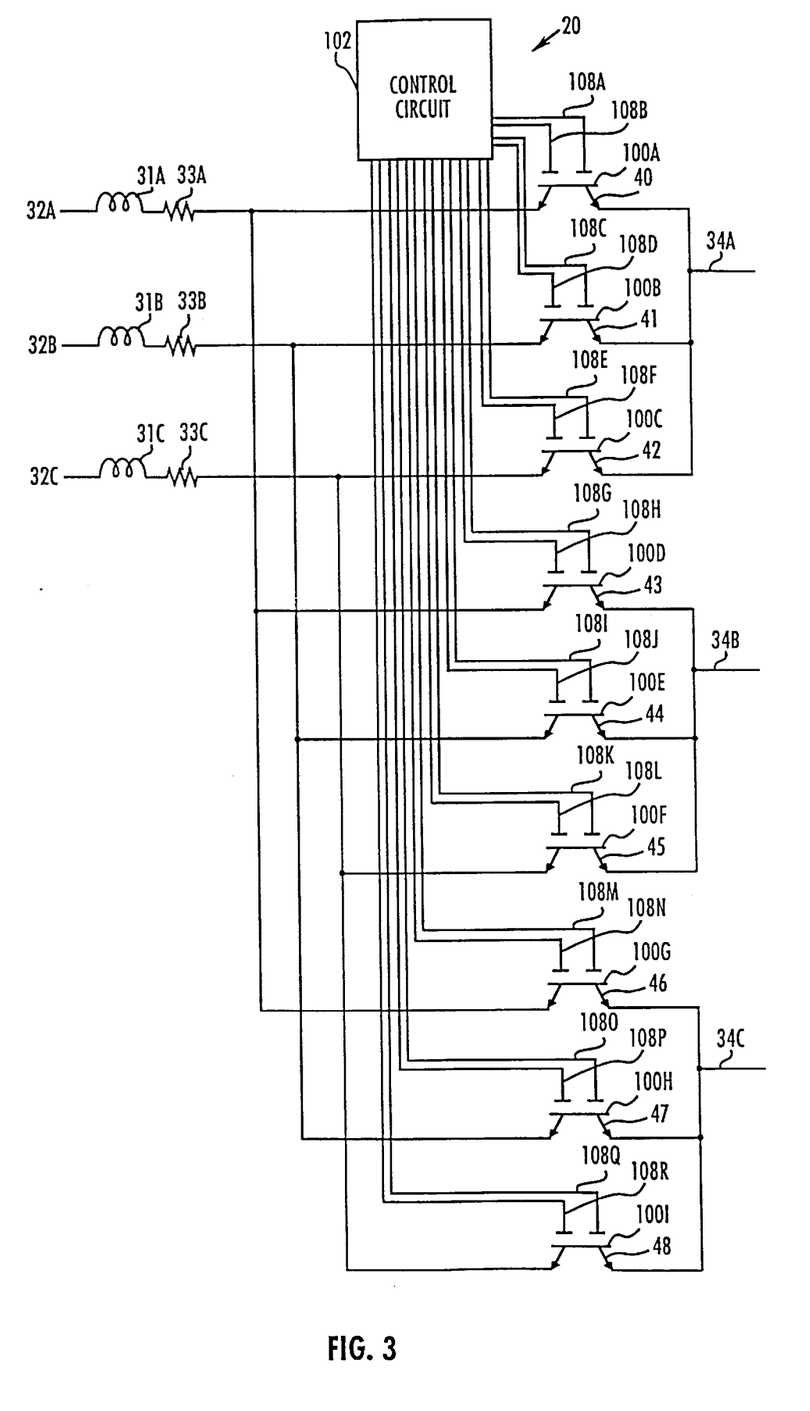
FIG. 3 is an electrical schematic block diagram of the matrix converter illustrated in FIG. 1, utilizing IGBTs in accordance with another exemplary embodiment of the present invention.

With reference to FIG. 3, IGBT 100 is shown implemented in matrix converter 20, which is illustrated in more detail in FIG. 1. With reference to FIG. 3, a control circuit 102 is coupled by a bus 108, which includes 18 control lines 108a–r coupled to gate terminals 106 and 108 (FIG. 2) of switches 40–48 (IGBTs 100a–i). Control circuit 102 controls IGBTs 100a–i so that only one IGBT of IGBTs 100a–i in each group associated with output lines 34a–c is conducting in either direction at a time. (However, some overlap is needed for current commutation). Control circuit 102 may be a microprocessor controlled driver circuit, a logic array, an analog control circuit, digital control circuit, or other device for providing appropriate biases to contacts 106 and 108 of IGBTs 100a–i. Control circuit 102 turns on an IGBT of IGBTs 100a–i in a first direction by providing the gate signal to gate contact 106 and in a second direction by providing the gate signal to gate contact 108 via control lines 10a–r. The gate signal can be a logic signal, MOSFET potential or other electrical signal.

Figure 4:
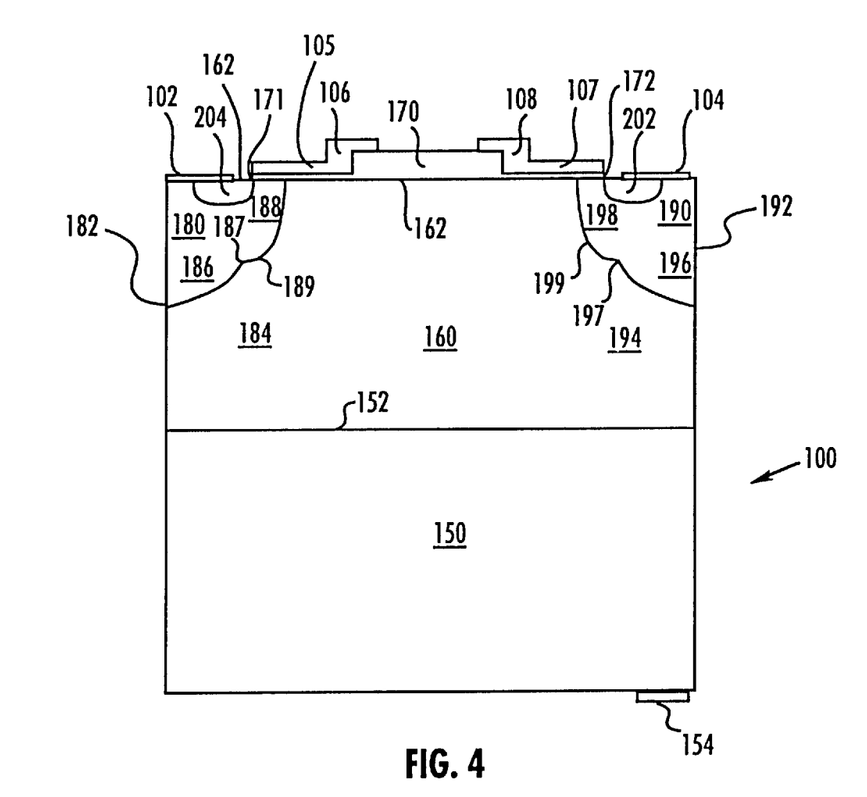
FIG. 4 is a cross-sectional view of a bidirectional IGBT in accordance with a further exemplary embodiment of the present invention.

With reference to FIG. 4, a cross-sectional view of IGBT 100 is shown. IGBT 100 includes a lightly doped P-type substrate 150 disposed below a lightly doped N-type drift region 160 which is disposed below a thin gate oxide layer 170. Oxide layer 170 is preferably silicon dioxide. A substrate contact 154 is coupled to substrate 150. Contact 154 is preferably coupled to a low voltage level, such as ground.

Gate contacts 106 and 108 or gate electrodes 105 and 107 are preferably coupled to either side of oxide layer 170. Gate electrodes 105 and 107 are preferably made from polysilicon, and each of gate electrodes 105 and 107 has a width of at least 10micrometers. A P-type region 180 is provided at a left side 182 of IGBT 100 above a left end 184 of drift region 160. P-type region 180 includes a first portion 186, which is heavily doped with P-type dopants, and a second portion 188, which is more lightly doped with P-type dopants. Similarly, a P-type region 190 is provided on a right side 192 of IGBT 100 above a right end 194 of end region 160. P-type region 190 has a first portion 196, which is heavily doped with P-type dopants, and a second portion 198, which is more lightly doped with P-type dopants.

An N-type region 202 is disposed above and partially surrounded (e.g., surrounded on three sides) by P-type region 190. Region 202 is heavily doped with N-type dopants. Similarly, an N-type region 204 is partially surrounded by and disposed slightly above P-type region 180. Region 204 is heavily doped with N-type dopants.

Emitter/collector contact 102 is directly coupled to region 204 and region 180. Collector/emitter contact 104 is directly coupled to region 202 and region 190. Gate electrode 105 is directly coupled to region 204, portion 188 of region 180, drift layer 160, and oxide layer 170. Similarly, gate electrode 107 is directly coupled to oxide layer 170, drift layer 160, portion 198 of region 190, and region 202.

With reference to FIG. 4, particular dimensions and doping concentrations associated with IGBT 100 are described in an exemplary fashion. The particular dimensions and doping concentrations are not shown in a limiting fashion. The scope of the present invention should be evaluated in accordance with the appending claims and not the following specifics.

Gate electrodes 105 and 107 preferably have a thickness of 0.8 micrometers and are made of polysilicon. Oxide layer 170 preferably has a thickness or height of 0.1 micrometers at an end 171 and an end 172. Oxide layer 170 has a width of 70 micrometers and a thickness of 2.0 micrometers at its middle.

IGBT 100 has a total width from left side 182 to right side 192 of 100 micrometers. The height from a top level of substrate 150, or junction 152 between substrate 150 and region 160, to a top 162 of transistor 100 is 10 micrometers. The height of portions of 188 and 198 of regions 180 and 190, respectively, to gate electrodes 105 and 107, respectively, from drift region 160 is 2.5 micrometers.

The distance from portion 188 of region 180 to end 171 of oxide layer 170 is approximately 5 micrometers. The distance from end 172 of layer 170 to portion 198 of region 190 is approximately 5 micrometers. Regions 202 and 204 are approximately 0.5 micrometers in height. The height of regions 180 and 190, or distance from contacts 102 and 104 to drift region 160 at ends 184 and 194, respectively, is approximately 3.5 micrometers. The height of drift region 160 at ends 184 and 194 from junction 152 to portions 186 and 196, respectively, is 6.5 micrometers.

Regions 180 and 190 preferably have curvilinear borders 189 and 199, respectively, with N-type drift region 160. Curvilinear junctions or borders 189 and 199 include a point 187 and a point 197, respectively, which divide portions 186 and 188 and portions 196 and 198, respectively. Points 187 and 197 are located approximately 2.5 micrometers below contacts 106 and 108. Substrate 150 has a height or thickness of at least 250 microns.

With reference to FIG. 4, doping concentrations associated with IGBT 100 are described below. Region 150 preferably is doped to a concentration of $7 \times 10^{13}$ P-type dopants per centimeter cubed. Drift region 160 is doped with $10^{14}$ N-type dopants per centimeter cubed. Portions 188 and 198 are doped with $10^{17}$ P-type dopants per centimeter cubed. Portions 186 and 196 are doped with $10^{19}$ P-type dopants per centimeter cubed. Portions 186 and 196 preferably have 100 times the dopant levels of portions 188 and 198. Regions 202 and 204 are doped with $10^{20}$ N-type dopants per centimeter cubed. IGBT 100 has a generally symmetrical configuration.

With reference to FIG. 4, IGBT 100 is a bidirectional lateral insulated gate bipolar transistor (LIGBT) using junction isolation. The operation of IGBT 100 is described as follows.

The operation of IGBT 100 is similar to the operation of a conventional IGBT. To turn on IGBT 100 to flow current from collector 104 to collector 102, a positive gate potential must be provided to gate electrode 105. Once the gate potential reaches beyond a MOSFET threshold, preferably, a voltage of at least 2 volts, a channel under gate electrode 105 is formed and electrons are injected from region 204 at contact 102 through portion 188 of region 180 to drift region 160. Assuming that emitter/collector contact 104 is positive with respect to collector/emitter contact 102, holes are injected from portion 196 of region 190 to region 160. When this happens, region 160 is flooded with electrons and holes, and IGBT 100 operates as a bipolar PNP device. Electrons are collected at collector/emitter terminal 104, and holes are collected at emitter/collector terminal 102. The total current flow is via a current path from contact 104 to contact 102 when the positive gate potential is provided at gate electrode 105 and the collector potential is provided from contact 104 to contact 102.

To flow current from contact 102 to contact 104 on the current path (e.g., the opposite direction), a positive potential is provided to gate electrode 107 and a positive potential is provided from contact 102 to contact 104. Once gate potential at electrode 107 reaches beyond a MOSFET threshold voltage, preferably a voltage of at least 2 volts, a channel under gate contact 108 is formed and electrons are injected from region 202 at contact 104 through portion 198 of region 190 to drift region 160. Assuming now that emitter/collector contact 102 is positive with respect to collector/emitter contact 104, holes are injected from portion 186 of region 180 to region 160. When this happens, region 160 is flooded with electrons and holes, and IGBT 100 operates like a PNP bipolar device in the reverse direction. Now, electrons are collected at terminal 102, and holes are collected at contact 104.

To turn off IGBT 100, when current is flowing in either direction, the potential at both gate electrodes 105 and 107 is removed. Removing potentials, or gate signals, at gate electrodes 105 and 107 cuts off the electron channel under the respective gate electrodes 105 and 107. Once this happens, IGBT 100 loses its electron current, which injects the hole current in drift layer 160, and current cannot flow in any direction on the current path between contacts 102 and 104. Thus, IGBT 100 can be controlled to allow current to flow in a first direction or a second direction via signals at gate electrodes 105 and 107.

When current is not flowing in IGBT 100, IGBT 100 can block high voltage in either direction because of drift region 160 is reverse biased with respect to substrate 150 at junction 152. IGBT 100 takes advantage of a RESURF operation to block high voltage in both directions via junction 152. The RESURF operation utilizes horizontal PN junction 152 associated with substrate 150 and region 160 to influence the breakdown of vertical junctions associated with regions 180 and 190. If regions 180 and 190 are thin enough (e.g., small height), the depletion of vertical PN junctions, such as those associated with regions 180 and 190, is substantially reinforced by the horizontal PN junction 152 associated with substrate 150 and drift region 160. Beneath a particular thickness (e.g., 10 micrometers) of the epitaxial layer (e.g., regions above substrate 150), the RESURF operation substantially prevents both the surface breakdown and the breakdown of the vertical junctions associated with regions 180 and 190 due to the high voltage breakdown associated with horizontal PN junction 152 associated with substrate 150 and region 160. Due to the lateral and symmetric nature of IGBT 100, horizontal junction 152 provides voltage blocking augmentation in both directions.

Figure 5:
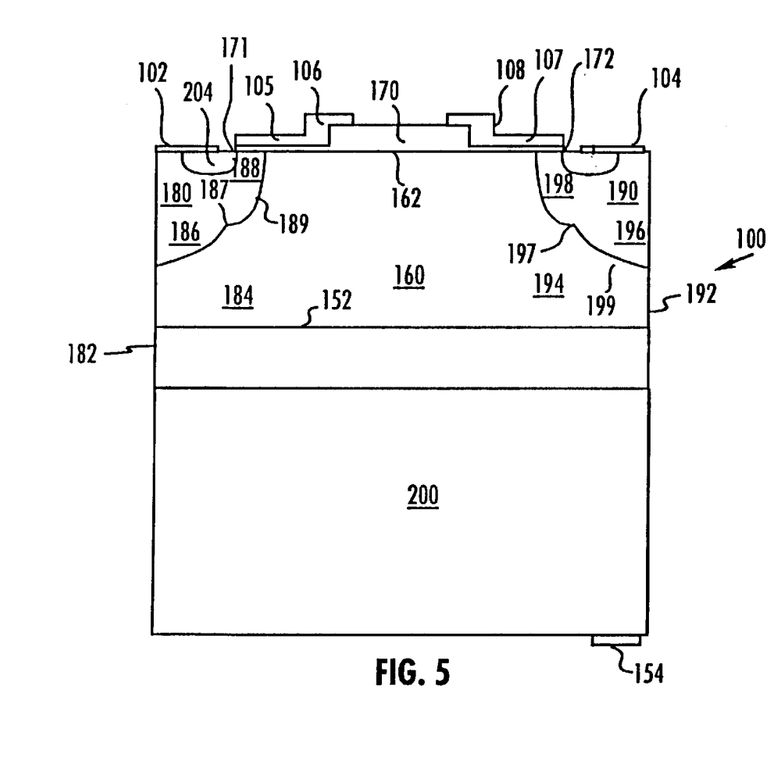
FIG. 5 is a cross-sectional view of a bidirectional IGBT in accordance with yet another exemplary embodiment of the present invention.

With reference to FIG. 5, IGBT 100 is a bidirectional lateral insulated gate bipolar transistor (LIGBT) using dielectric isolation. In accordance with the second exemplary embodiment in the present invention, an IGBT 100 includes a buried oxide region 182 between an N-type substrate 200 and N-type drift region 160. Substrate 200 is doped to a concentration of $10^{18}$ N-type dopants per centimeter cubed and has a width of 100 micrometers. Oxide layer or region 182 is preferably silicon dioxide and has a height of 5 micrometers. Substrate 200 preferably has a height of 500 micron. Substrate contact 154 is preferably provided at a bottom of substrate 200. Substrate contact 154 is preferably tied to a low voltage level, such as ground.

IGBT 100 in FIG. 5 operates substantially the same as the IGBT 100 illustrated in FIG. 4. However, IGBT 100 utilizes oxide region 182 and substrate 200 to provide the RESURF operation. The combination of substrate 200 and oxide region 182 operates as a field plate that extends the depletion region towards top 162 of IGBT 100 and hence reduces the surface electric field according to the RESURF operation. The thicker oxide layer 182 is, at least to some extent, the larger the breakdown voltage can be. Preferably, an optimized breakdown voltage can be achieved with a 12 micrometer thickness of the epilayer (e.g., regions 180 and 190) and a 10 micrometer thickness of layer 182. Preferably, the epitaxial layer has a thickness below 50 micrometers in accordance with the RESURF operation. For epitaxial layers having a thickness of 10 micrometers or less, the breakdown voltage can be higher, depending upon the concentration of dopants in drift region 160. Higher breakdown voltages come at the expense of higher on-state voltage drops. The lower the concentration of dopants in region 160, the higher the breakdown voltage and the higher the on-state voltage drop. IGBT 100 exhibits excellent on-state voltage drop and current density characteristics.

By utilizing the RESURF principle, IGBT 100 in FIG. 5 can block approximately 900 volts when the width of region 160 is approximately 150 micrometers. If the thickness of drift region 160 is increased, the breakdown voltage can even be larger. Similarly, IGBT 100 in FIG. 4 can block at least 550 volts when the width of the drift region is 60 micrometers. IGBT 100 can block higher voltages if the thickness oxide layer 182 is increased.

Figure 6:
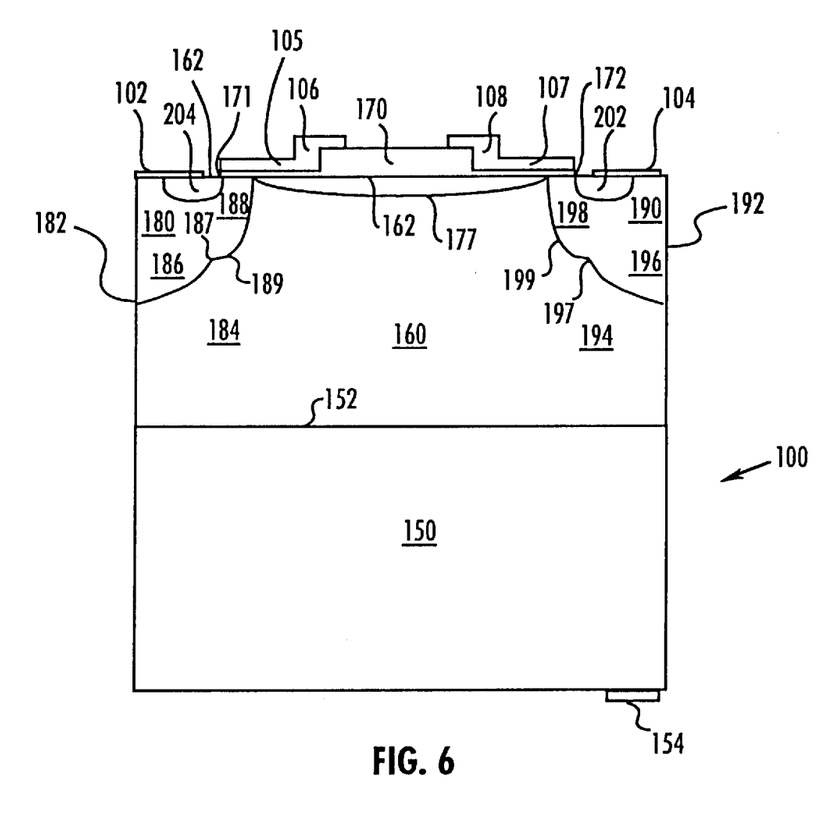
FIG. 6 is a cross-sectional view of a bidirectional IGBT in accordance with still another exemplary embodiment of the present invention.

With reference to FIG. 6, an IGBT is shown including a double RESURF structure. In FIG. 6, the breakdown region of IGBT 100 is enhanced by providing a doped region 177 below oxide layer 170. Doped region 177 can be a P-type or N-type region having a doping concentration of one or two orders of magnitude above the doping concentration of region 160. The height of region 177 is preferably between 0.5 micrometers and 2.0 micrometers. IGBT 100 in FIG. 6 operates similar to IGBT 100 in FIG. 4.

Alternatively, IGBT 100 can be configured with opposite type doping concentrations. For example, with reference to FIG. 4, substrate layer 150 could be lightly doped with an N-type dopant, drift region 160 could be lightly doped with a P-type dopant, regions 180 and 190 could be doped with an N-type dopant and regions 202 and 204 could be doped with a P-type dopant. With reference to FIG. 5, IGBT 100 could have a substrate 200 heavily doped with a P-type substrate, and the remaining regions could be doped oppositely to the regions shown in FIG. 5 as described above. The type of IGBT 100 configuration, whether a N-channel or a P-channel type, should not limit the scope of the present invention.

Further still, the lateral nature of IGBT 100 allows use of inexpensive fabrication methods for production of larger quantities of IGBTs 100. In this way, IGBTs 100 may be placed side-by-side and a greater economy of scale may be reached in achieving appropriate doping levels for substrates 150 and 200. Further still, the use of lateral IGBTs allows simple interconnections between adjacent IGBTs as contacts are on a single surface; thus, even integrated connections between IGBTs can be achieved.

Figure 7:
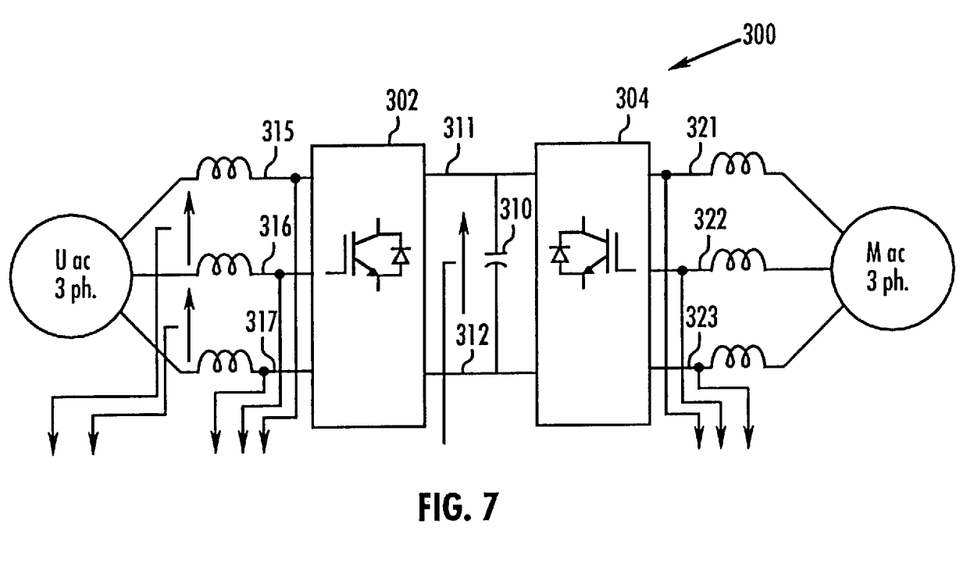
FIG. 7 is a general block diagram of a motor controller, including a voltage source converter.

FIG. 7 shows a power application for a three-phase motor driver system 300. System 300 includes a diode rectifier stage or voltage source converter stage 302 and an inverter circuit 304. System 300 receives AC power on input conductors 315, 316, and 317 and provides AC power on output conductors 321, 322, and 323. Voltage source converter stage 302 converts the AC power on conductors 315, 316, and 317 to DC power on conductors 311 and 312. Inverter circuit 304 generates AC power from the DC power on conductors 311 and 312. IGBTs 100 in FIGS. 4 and 5 can be utilized in stage 302 and circuit 304 to provide rectifying and inverting operations.

Figure 8:
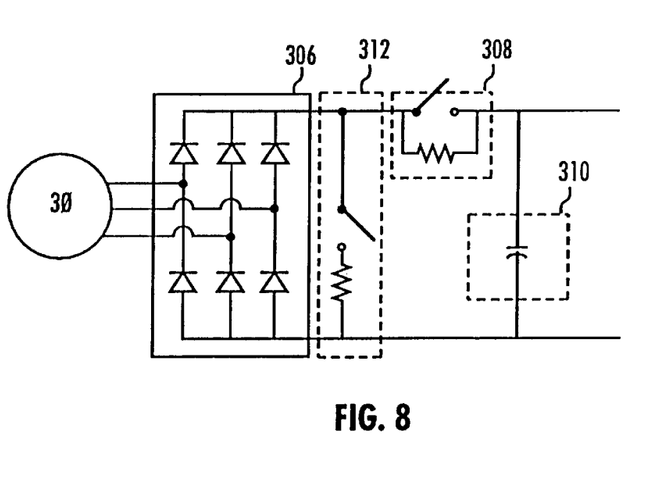
FIG. 8 is an exemplary block diagram of the voltage source converter illustrated in FIG. 6, which can utilize the IGBT illustrated in FIGS. 4 and 5 in accordance with still a further exemplary aspect of the present invention.

Diode rectifier 302, as shown in FIG. 8, includes diode bridge 306, a precharge circuit 308, a dynamic brake 312 and a capacitor bank 310. Precharge circuit 308 and diode bridge 306 are utilized to slowly charge up capacitor bank 310. Conventional precharge circuits require two semiconductor switches or one semiconductor switch and a diode in anti-parallel to use dynamic brake 312. However, precharge circuit 308 and diode bridge 306 can be replaced with circuit using bidirectional IGBT switches, such as IGBT 100 shown in FIGS. 4, 5 and 6. Additionally, the semiconductor switch in dynamic brake 308 can utilize a bidirectional IGBT such as IGBT 100.

It is understood that, while the detailed drawings, specific examples, and particular component values given describe preferred exemplary embodiments of the present invention, they are for the purpose of illustration only. The apparatus of the invention is not limited to the applications shown, doping concentrations described, dimensions disclosed, or specific geometries shown. For example, although the oxide layer in the bidirectional IGBT is shown to have a 70 micrometer width, other dimensions could be utilized. Also, although particular power applications are described, the IGBT may be utilized in any type of electronic application. Further still, single lines in the various drawings may represent multiple conductors. Various changes may be made to the details disclosed by departing from the spirit of the invention which is defined by the following claims.

What is claimed is:

1. A power conversion circuit, comprising:
 a plurality of input conductors, the input conductors being configured to receive a plurality of phases of input power;
 an array of bidirectional insulated gate bipolar transistors, the array being coupled to the input conductors, the bidirectional insulated gate bipolar transistors including a double RESURF structure wherein the double RESURF structure allows the bidirectional insulated gate transistors to block over 300 volts in both directions, wherein a first gate contact and a second gate contact are disposed above a gate oxide, the gate oxide having a thick portion disposed between a first thin portion and a second thin portion;
 a control circuit coupled to the array, the control circuit controlling the operation of the array; and
 a plurality of output conductors coupled to the array, wherein each insulated gate transistor includes;
 a semiconductor substrate;
 a drift region disposed above the substrate, the drift region having a first end, a second end, and a middle section;
 a doped region disposed above the drift region:
 an emitter/collector region disposed above the first end of the drift region, the emitter/collector region having a first portion and a second portion, the first portion being more heavily doped with a first type dopant than the second portion:
 a collector/emitter region disposed above the second end of the drift region, the collector/emitter region having a first portion and a second portion, the first portion being more heavily doped with the fist type dopant than the second portion;
 a first region disposed above the emitter/collector region, the first region being doped with a second type dopant, the second type dopant having an appositive conductivity type to the first dopant;
 a second region disposed above the collector/emitter region, the second region being doped with the second type dopant;
 an emitter/collector contact coupled to the first region and the emitter/collector region; and
 a collector/emitter contact coupled to the second region and the collector/emitter region;
 wherein the first gate contact is coupled to the oxide gate and disposed above the first region and the second gate contact is coupled to the oxide gate and disposed above the second region and wherein the double RESURF structure includes a first RESURF structure associated with said drift region and said substrate and a second RESURF structure associated with said doped region and said drift region.

2. The power conversion circuit of claim 1, wherein the array includes nine bidirectional insulated gate bipolar transistors.

3. The power conversion circuit of claim 1 wherein each of the bidirectional switches includes two gate contacts.

4. The power conversion circuit of claim 1 wherein the control circuit provides a plurality of gate signals to control the operation of the array.

5. A method of performing power conversion in a converter including a control circuit and an insulated gate bipolar transistor, the insulated gate bipolar transistor having a first gate and a second gate, the first gate and the second gate being coupled to the control circuit via a first control line and a second control line, the insulated gate bipolar transistor being a lateral bidirectional transistor including a double RESURF structure wherein the transistor includes a gate oxide layer disposed beneath the first gate and the second gate, the gate oxide layer having a thick portion disposed between a first thin portion and a second thin portion, wherein each insulated gate transistor includes:

a semiconductor substrate;

a drift region disposed above the substrate, the drift region having a first end, a second end, and a middle section;

a doped region disposed above the drift region;

an emitter/collector region disposed above the first end of the drift region, the emitter/collector region having a first portion and a second portion, the first portion being more heavily doped with a first type dopant than the second portion;

a collector/emitter region disposed above the second end of the drift region, the collector/emitter region having a first portion and a second portion, the first portion being more heavily doped with the fist type dopant than the second portion;

a first region disposed above the emitter/collector region, the first region being doped with a second type dopant, the second type dopant having an appositive conductivity type to the first dopant;

a second region disposed above the collector/emitter region, the second region being doped with the second type dopant;

an emitter/collector contact coupled to the first region the emitter/collector region;

a collector/emitter contact coupled to the second region the collector/emitter region; and     wherein the first gate contact is coupled to the oxide layer and disposed above the first region and the second gate contact is coupled to the oxide layer and disposed above the second region and wherein the double RESURF structure includes a first RESURF structure associated with said drift region and said substrate and a second RESURF structure associated with said doped region and said drift region;

the method comprising steps of:

providing a first gate signal with said control circuit to the first gate via the first control line, the first gate signal causing the insulated gate bipolar transistor to conduct in a first direction;

providing a second gate signal with said control circuit to the second gate via the second control line, the second gate signal causing the insulated gate bipolar transistor to conduct in a second direction, the second direction being opposite the first direction; and     blocking high voltage in the first direction and the second direction when the first gate signal and the second gate signal are not present by utilizing the double RESURF structure, wherein the gate oxide structure and double RESURF structure allow the bidirectional insulated gate transistors to block over 300 volts in both directions.

6. The method of claim 5 wherein the first and second gate signals are MOSFET signals.

7. The method of claim 6 wherein the first and second gate signals are between 0 and 5 volts.

8. The method of claim 5 wherein the insulated gate bipolar transistor is employed in a three phase matrix converter.

9. A matrix AC power conversion circuit comprising:

a plurality of input conductors;

a plurality of output conductors;

an array of IGBTs coupled between the plurality of output conductors and input conductors, wherein each IGBT of said IGBTs includes a first gate contact, a second gate contact, and a double RESURF structure and wherein the insulated gate bipolar transistors include a first gate contact and a second gate contact disposed above a gate oxide, the gate oxide layer having a thick portion disposed between a first thin portion and a second thin portion; and     a control circuit coupled to said first gate contact and said second gate contact of each of said IGBTS, wherein each of said IGBTs conducts in a first direction in response to a first gate signal from said control signal at said first gate contact and each of said IGBTs conducts in a second direction in response to a second gate signal from said control circuit at said second gate contact, the first direction being opposite said second direction, wherein the IGBTs block high voltage in both directions via double RESURF structure, and, wherein each IGBT includes:

a substrate having a first side and a second side;

a drift region disposed above the substrate;

a doped region disposed above the drift region;

a first region disposed above the drift region adjacent the first side, the first region having a first portion and a second portion, the first portion being more heavily doped with a first type dopant than the second portion;

a second region disposed above the drift region adjacent the second side, the second region having a first portion and a second portion, the first portion being more heavily doped with the first type dopant than the second portion;

a third region disposed above and partially surrounded by the first region, the third region being doped with a second type dopant, the second type dopant having an opposite conductivity type to the first type dopant;

a fourth region disposed above and partially surrounded by the second region, the fourth region being doped with the second type dopant;

a first contact coupled to the first region and the third region;

a second contact coupled to the second region and the fourth region;

a first gate contact disposed above the third region and the drift region; and     a second gate contact disposed above the fourth region and the drift region, wherein the double RESURF structure includes a first RESURF structure associated with said drift region and said substrate and a second RESURF structure associated with said doped region and said drift region.

10. The power conversion circuit of claim 9 wherein the first and second gate signals are MOSFET signals.

11. The power conversion circuit of claim 10 wherein the first and second gate signals are between 0 and 5 volts.

12. The power conversion circuit of claim 9 wherein the plurality of input conductors includes:

a first input conductor;

a second input conductor;

a third input conductor;

wherein the plurality of output conductors include:

a first output conductor;

a second output conductor;

a third output conductor;

and wherein the array of IGBTs includes:

a first bidirectional IGBT coupled between the first input conductor and the first output conductor;

a second bidirectional IGBT coupled between the first input conductor and the second output conductor;

a third bidirectional IGBT coupled between the first input conductor and the third output conductor;

a fourth bidirectional IGBT coupled between the second input conductor and the first output conductor;

a fifth bidirectional IGBT coupled between the second input conductor and the second output conductor;

a sixth bidirectional IGBT coupled between the second input conductor and the third output conductor;

a seventh bidirectional IGBT coupled between the third input conductor and the first output conductor;

an eighth bidirectional IGBT coupled between the third input conductor and the second output conductor; and a ninth bidirectional IGBT coupled between the third input conductor and the third output conductor.

13. The power conversion circuit of claim 12 wherein the control circuit ensures that the first, fourth, and seventh IGBTs are not conducting at the same time, the second, fifth, and eighth IGBTs are not conducting at the same time, and the third, sixth, and ninth IGBTs are not conducting at the same time.

14. The power conversion circuit of claim 13 wherein the first portion of the first region is located closer to the first side than the second portion of the first region and the first portion of the second region is located closer to the second side than the second portion of the second region.

15. The power conversion circuit of claim 13 wherein the first and second regions have curved junctions with the drift region.

* * * * *